US012615721B2

(12) United States Patent
Ikeda et al.

(10) Patent No.: US 12,615,721 B2
(45) Date of Patent: Apr. 28, 2026

(54) WIRING CIRCUIT BOARD

(71) Applicant: NITTO DENKO CORPORATION, Osaka (JP)

(72) Inventors: Takahiro Ikeda, Osaka (JP); Teppei Niino, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 185 days.

(21) Appl. No.: 18/532,897

(22) Filed: Dec. 7, 2023

(65) Prior Publication Data

US 2024/0206079 A1    Jun. 20, 2024

(30) Foreign Application Priority Data

Dec. 15, 2022    (JP) ................................. 2022-200296

(51) Int. Cl.
        *H05K 3/38*            (2006.01)
        *H05K 1/02*            (2006.01)
(52) U.S. Cl.
        CPC ............. *H05K 3/38* (2013.01); *H05K 1/0298* (2013.01)
(58) Field of Classification Search
        None
        See application file for complete search history.

(56) References Cited

U.S. PATENT DOCUMENTS

2005/0167281 A1    8/2005  Ohsawa et al.

FOREIGN PATENT DOCUMENTS

| JP | H11-092916 A | 4/1999 |
|----|----|----|
| JP | 2002-057437 A | 2/2002 |
| JP | 2005-217250 A | 8/2005 |
| JP | 2011-198814 A | 10/2011 |
| TW | I766580 B | * 6/2022 |
| WO | 2022/102416 A1 | 5/2022 |

OTHER PUBLICATIONS

TWI766580B Machine Translation (Year: 2021).*

* cited by examiner

*Primary Examiner* — Laura C Powers
(74) *Attorney, Agent, or Firm* — Edwards Neils LLC; Jean C. Edwards, Esq.

(57)            ABSTRACT

A wiring circuit board includes a metal supporting layer, an adhesion layer, a first conductive layer, an insulating layer, and a second conductive layer. The adhesion layer is disposed on one-side surface of the metal supporting layer in the thickness direction, and contains at least one metal selected from the group Zr, Ti, W, Mo, V, Y, Nb, and Ta. The first conductive layer is disposed on one-side surface of the adhesion layer in the thickness direction, and has an insulating layer with a penetrating hole disposed on a one-side surface thereof. The second conductive layer includes a portion electrically connected with the metal supporting layer through the adhesion layer located in the penetrating hole. The second conductive layer is located at one side of the metal supporting layer in the penetrating hole and one side of the insulating layer in the thickness direction.

9 Claims, 7 Drawing Sheets

1A

1A

1

1S

WIRING CIRCUIT BOARD

CROSS-REFERENCE TO RELATED APPLICATION

The present application claims priority from Japanese Patent Application No. 2022-200296 filed on Dec. 15, 2022, the contents of which are hereby incorporated by reference into this application.

TECHNICAL FIELD

The present invention relates to a wiring circuit board.

BACKGROUND ART

There has been a known wiring circuit board including a metal supporting layer, a first conductive layer, an insulating layer, and a second conductive layer in sequence toward one side in the thickness direction (for example, see Patent Document 1 below).

In the wiring circuit board described in Patent Document 1, the insulating layer has a penetrating hole. The second conductive layer is electrically connected with the metal supporting layer through the first conductive layer located in the penetrating hole when being projected in the thickness direction

CITATION LIST

Patent Document

Patent Document 1: Japanese Unexamined Patent Publication No. 2011-198814

SUMMARY OF THE INVENTION

Problem to be Solved by the Invention

There is a need for improvement of the adhesion of the first conductive layer to the metal supporting layer in such a wiring circuit board. However, the above-described adhesion is insufficient in the wiring circuit board described in Patent Document 1.

The present invention provides a wiring circuit board in which the adhesion of the first conductive layer to the metal supporting layer can be improved.

Means for Solving the Problem

The present invention [1] includes a wiring circuit board including: a metal supporting layer; an adhesion layer disposed on a one-side surface of the metal supporting layer in a thickness direction and containing at least one metal selected from the group consisting of Zr, Ti, W, Mo, V, Y, Nb, and Ta; a first conductive layer disposed on a one-side surface of the adhesion layer in the thickness direction; an insulating layer having a penetrating hole and disposed on a one-side surface of the first conductive layer in the thickness direction; and a second conductive layer including a portion that is electrically connected with the metal supporting layer through the adhesion layer that is located in the penetrating hole when being projected in the thickness direction, the second conductive layer disposed at one side of the metal supporting layer in the penetrating hole and one side of the insulating layer in the thickness direction.

The wiring circuit board includes the adhesion layer disposed on the one-side surface of the metal supporting layer in the thickness direction and containing at least one metal selected from the group consisting of Zr, Ti, W, Mo, V, Y, Nb, and Ta. This improves the adhesion of the first conductive layer to the metal supporting layer.

The present invention [2] includes the wiring circuit board described in the above-described [1], wherein a content ratio of the metal in the adhesion layer is 0.8% or less.

In the wiring circuit board, the content ratio of the metal in the adhesion layer is 0.8% or less, i.e., low. This suppresses the increase in the resistance of the interface between the adhesion layer and the metal supporting layer and the increase in the resistance of the interface between the adhesion layer and the first conductive layer while securing the adhesion of the adhesion layer to the metal supporting layer.

The present invention [3] includes the wiring circuit board described in the above-described [1] or [2], wherein the first conductive layer contains Cr and/or Ni.

The present invention [4] includes the wiring circuit board described in any one of the above-described [1] to [3], wherein the metal supporting layer contains Cu.

The present invention [5] includes the wiring circuit board described in any one of the above-described [1] to [4], further including: a second adhesion layer electrically connecting the first conductive layer to the second conductive layer and disposed between the first conductive layer located in the penetrating hole when being projected in the thickness direction and the second conductive layer.

The present invention [6] includes the wiring circuit board described in the above-described [5], wherein the second adhesion layer contains the metal.

The present invention [7] includes the wiring circuit board described in the above-described [6], wherein the second conductive layer contains at least one selected from the group consisting of Cu, Cr, and Ni.

The present invention [8] includes the wiring circuit board described in any one of the above-described [1] to [4], wherein the adhesion layer disposed on a one-side surface of the metal supporting layer in the penetrating hole is thicker than the adhesion layer disposed on the one-side surface of the metal supporting layer outside the penetrating hole.

The present invention [9] includes the wiring circuit board described in any one of the above-described [1] to [8], further including a third conductive layer disposed on a one-side surface of the second conductive layer in the thickness direction.

Effects of the Invention

In the wiring circuit board of the present invention, the adhesion of the first conductive layer to the metal supporting layer can be improved.

BRIEF DESCRIPTION OF THE DRAWINGS

FIG. 2A illustrates the step of preparing a metal supporting layer. FIG. 2B illustrates the step of forming an adhesion layer.

FIG. 2C illustrates the step of forming a first conductive layer. FIG. 2D illustrates the step of forming an insulating layer.

FIG. 2E illustrates the step of forming a second adhesion layer. FIG. 2F illustrates the step of forming a second conductive layer.

FIG. 4A illustrates the step of preparing a metal supporting layer. FIG. 4B illustrates the step of forming an adhesion layer.

FIG. 4C illustrates the step of forming a first conductive layer. FIG. 4D illustrates the step of forming an insulating layer.

FIG. 4E illustrates the step of forming a second adhesion layer. FIG. 4F illustrates the step of forming a second conductive layer.

FIG. 5 is also a cross-sectional view of a part of the third variation of the wiring circuit board.

FIG. 6A is a plan view of the wiring circuit board in the middle of its production.

FIG. 6B is a cross-sectional view of the wiring circuit board in the middle of its production.

FIG. 7A illustrates a test board. FIG. 7B is a schematic view depicting a tensile test.

DESCRIPTION OF THE EMBODIMENT

1. One Embodiment

Figure 1:
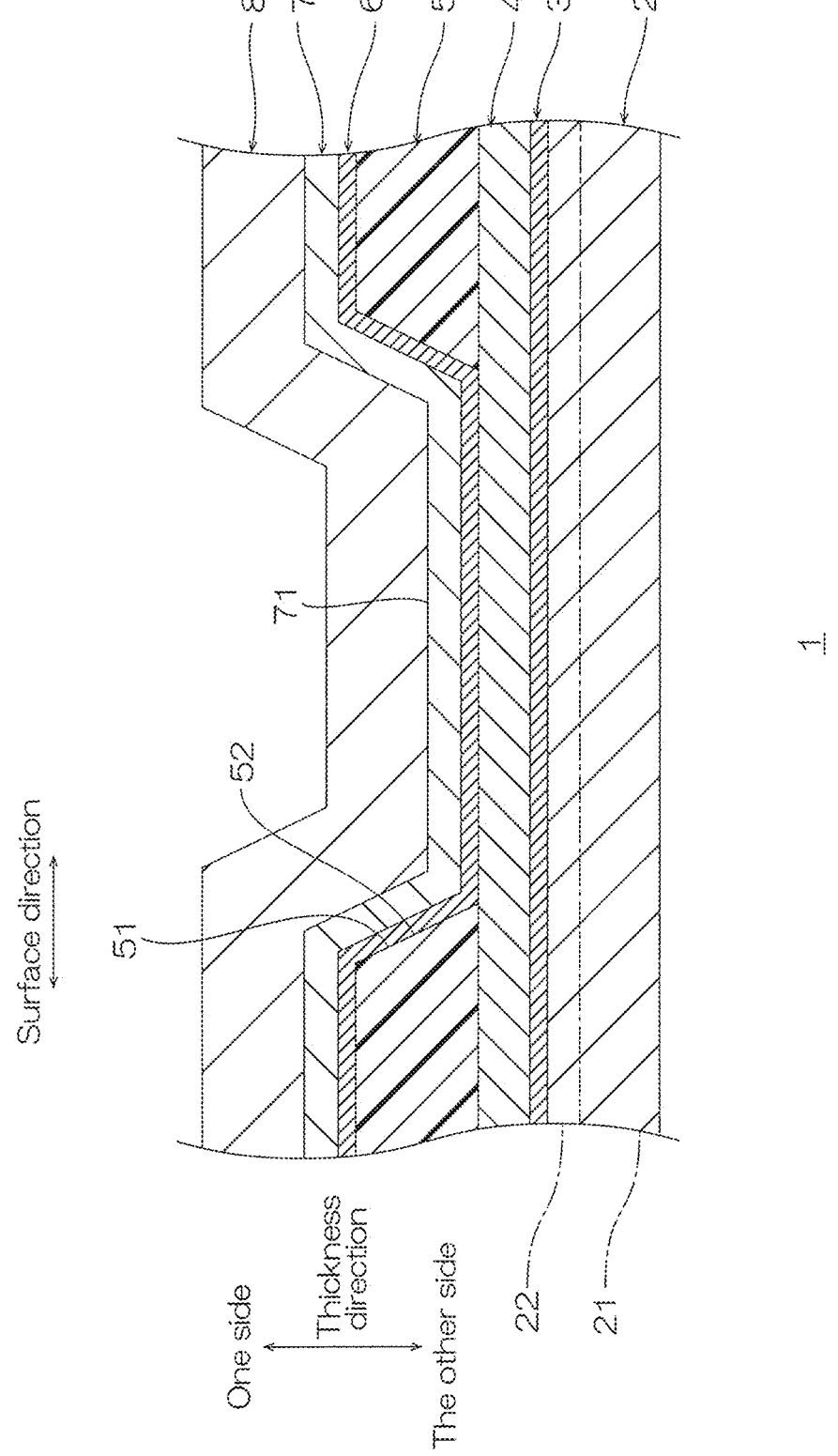
FIG. 1 is a cross-sectional view of a part of one embodiment of the wiring circuit board of the present invention.

With reference to FIG. 1, one embodiment of the wiring circuit board of the present invention is described.

As illustrated in FIG. 1, a wiring circuit board 1 has a thickness. The wiring circuit board 1 extends in a surface direction. The surface direction is orthogonal to the thickness direction. The wiring circuit board 1 has the shape of a sheet or a film. The sheet and the film are not distinguished from each other. The wiring circuit board 1 includes a metal supporting layer 2, an adhesion layer 3, a first conductive layer 4, an insulating layer 5, a second adhesion layer 6, a second conductive layer 7, and a third conductive layer 8.

1.1 Metal Supporting Layer 2

The metal supporting layer 2 is disposed in the other end portion of the wiring circuit board 1 in the thickness direction. The metal supporting layer 2 extends in the surface direction. The metal supporting layer 2 has the shape of a board.

The metal supporting layer 2 extends in the surface direction. Examples of the material of the metal supporting layer 2 include aluminum, copper, silver, nickel, chromium, titanium, tantalum, platinum, gold, and an alloy. Examples of the alloy include a stainless-steel, a 42 alloy, and a copper alloy. As the alloy, a copper alloy is preferably used. Preferable examples of the material of the metal supporting layer 2 include copper and a copper alloy. The metal supporting layer 2 preferably contains Cu.

The metal supporting layer 2 has a thickness of, for example, 15 μm or more, and, for example, 500 μm or less, preferably 250 μm or less.

1.2 Adhesion Layer 3

The adhesion layer 3 is disposed on a one-side surface of the metal supporting layer 2 in the thickness direction. The adhesion layer 3 is in contact with the one-side surface of the metal supporting layer 2 in the thickness direction. The adhesion layer 3 extends in the surface direction. The adhesion layer 3 brings the first conductive layer 4 into tight contact with the metal supporting layer 2.

The adhesion layer 3 is formed, for example, from a metal material containing a first metal. The metal material preferably consists of the first metal and the material of the first conductive layer 4 described next.

Examples of the first metal include at least one selected from the group consisting of Zr, Ti, W, Mo, V, Y, Nb, and Ta. In other words, the adhesion layer 3 contains the first metal that is at least one selected from the group consisting of Zr, Ti, W, Mo, V, Y, Nb, and Ta. As the first metal, Zr and Ti are preferable. Zr is more preferable.

The content ratio of the first metal in the adhesion layer 3 is, for example, 5.0% or less, preferably 1.2% or less, more preferably 0.8% or less, particularly preferably 0.6% or less. Where the content ratio of the first metal in the adhesion layer 3 is the above-described upper limit or less, the increase in the resistance of the interface between the adhesion layer 3 and the metal supporting layer 2 and the increase in the resistance of the interface between the adhesion layer 3 and the first conductive layer 4 are suppressed while the adhesion of the adhesion layer 3 to the metal supporting layer 2 is secured.

The lower limit of the content ratio of the first metal in the adhesion layer 3 is not limited. The lower limit of the content ratio of the first metal in the adhesion layer 3 is, for example, 0.1%.

The content ratio of the first metal in the adhesion layer 3 is measured using dynamic SIMS.

The adhesion layer 3 has a thickness of, for example, 1 nm or more, preferably 2 nm or more, and, for example, 50 nm or less, preferably 30 nm or less. The thickness of the adhesion layer 3 is obtained as a range in which the strength is 90% or more relative to the peak strength (maximum value) in the dynamic SIMS of the first metal.

1.3 First Conductive Layer 4

The first conductive layer 4 is disposed on a one-side surface of the adhesion layer 3 in the thickness direction. The first conductive layer 4 is in contact with the one-side surface of the adhesion layer 3 in the thickness direction. The first conductive layer 4 extends in the surface direction.

Examples of the material of the first conductive layer 4 include chromium, nickel, titanium, and an alloy thereof. Preferable examples of the material of the first conductive layer 4 include chromium, nickel, and Nichrome. In other words, the first conductive layer 4 preferably contains chromium and/or nickel.

The first conductive layer 4 has a thickness of, for example, 5 nm or more, preferably 10 nm or more, and, for example, 1000 nm or less, preferably 500 nm or less.

1.4 Insulating Layer 5

The insulating layer 5 is disposed on a one-side surface of the first conductive layer 4 in the thickness direction. The insulating layer 5 is in contact with the one-side surface of the first conductive layer 4 in the thickness direction. The insulating layer 5 extends in the surface direction. In the present embodiment, the insulating layer 5 is an insulating base layer.

The insulating layer 5 has a penetrating hole 51. The penetrating hole 51 penetrates the insulating layer 5 in the thickness direction. The insulating layer 5 has an inner surface 52 defined by the penetrating hole 51. The inner surface 52 has an approximately tapered shape in the cross-sectional view. The inner surface 52 is inclined outward toward one side in the thickness direction. Thus, the penetrating hole 51 has a horizontal cross-sectional area that gradually increases toward one side in the thickness direction.

Examples of the material of the insulating layer 5 include insulating resin. Examples of the insulating resin include polyimide. The insulating resin has flexibility.

The insulating layer 5 has a thickness of, for example, 1 μm or more, preferably 3 μm or more, and, for example, 35 μm or less.

1.5 Second Adhesion Layer 6

The second adhesion layer 6 is disposed on a one-side surface of the insulating layer 5 in the thickness direction. Further, the second adhesion layer 6 is also disposed on an inner surface 52 of the insulating layer 5. Furthermore, the second adhesion layer 6 is also disposed on a one-side surface of the first conductive layer 4 located in the penetrating hole 51 when being projected in the thickness direction. The second adhesion layer 6 is in contact with the one-side surface of the insulating layer 5, the inner surface 52 of the insulating layer 5, and the one-side surface of the first conductive layer 4 located in the penetrating hole 51. The second adhesion layer 6 extends in the surface direction. The second adhesion layer 6 brings the second conductive layer 7 into tight contact with the insulating layer 5 and with the first conductive layer 4 located in the penetrating hole 51 when being projected in the thickness direction. Further, the second adhesion layer 6 improves the adhesiveness of the second conductive layer 7 to the insulating layer 5.

The second adhesion layer 6 disposed on the one-side surface and inner surface 52 of the insulating layer 5 is formed from the metal material cited in the description of the adhesion layer 3, and preferably consists of a metal material containing the first metal. The metal material preferably consists of the first metal and the material of the second conductive layer 7 described next. The first metal is the same as the first metal cited in the description of the first adhesion layer 3.

The content ratio of the first metal in the second adhesion layer 6 located on the one-side surface and inner surface 52 of the insulating layer 5 is, for example, 5.0% or less, preferably 1.2% or less, more preferably 0.8% or less, particularly preferably 0.6% or less, and, for example, 0.1% or more.

When the content ratio of the first metal in the second adhesion layer 6 is the above-described upper limit or less, the adhesiveness of the second conductive layer 7 to the insulating layer 5 is improved.

The second adhesion layer 6 has a thickness of, for example, 1 nm or more, preferably 2 nm or more, and, for example, 50 nm or less, preferably 30 nm or less. The thickness of the second adhesion layer 6 is obtained as a range in which the strength is 50% or more relative to the peak strength (maximum value) in the dynamic SIMS of the first metal of the insulating layer 5.

1.6 Second Conductive Layer 7

The second conductive layer 7 is disposed at one side of the metal supporting layer 2 in the penetrating hole 51 and one side of the insulating layer 5 in the thickness direction. The second conductive layer 7 is disposed on a one-side surface of the second adhesion layer 6 in the thickness direction. The second conductive layer 7 is in contact with the one-side surface of the second adhesion layer 6. Then, the second adhesion layer 6 is disposed between the first conductive layer 4 located in the penetrating hole 51 when being projected in the thickness direction and the second conductive layer 7. Thus, the second adhesion layer 6 electrically connects the first conductive layer 4 to the second conductive layer 7. Therefore, the second conductive layer 7 includes a portion 71 that is electrically connected with the metal supporting layer 2 through the first conductive layer 4 located in the penetrating hole 51 when being projected in the thickness direction and the adhesion layer 3. The portion 71 is disposed at one side of the metal supporting layer 2 in the penetrating hole 51.

The portion 71 is located inside the penetrating hole 51. The second conductive layer 7 extends in the surface direction. The second conductive layer 7 may be patterned.

Examples of the material of the second conductive layer 7 include copper, chromium, nickel, titanium, and an alloy thereof. Examples of the material of the second conductive layer 7 include copper, chromium, nickel, and an alloy thereof. In other words, the second conductive layer 7 preferably includes at least one selected from the group consisting of Cu, Cr, and Ni.

The second conductive layer 7 has a thickness of, for example, 5 nm or more, preferably 10 nm or more, and, for example, 1000 nm or less, preferably 500 nm or less.

1.7 Third Conductive Layer 8

The third conductive layer 8 is disposed on a one-side surface of the second conductive layer 7 in the thickness direction. The third conductive layer 8 is in contact with the one-side surface of the second conductive layer 7 in the thickness direction. The third conductive layer 8 extends in the surface direction.

Examples of the material of the third conductive layer 8 include copper.

The third conductive layer 8 has a thickness of, for example, 3 μm or more, preferably 5 μm or more, and, for example, 100 μm or less, preferably 50 μm or less.

Although not illustrated, the wiring circuit board 1 may further include an insulating cover layer. The insulating cover layer covers a part of the third conductive layer 8.

1.7 Method of Producing Wiring Circuit Board 1

With reference to FIG. 1 and FIGS. 2A to 2F, a method of producing the wiring circuit board 1 is described.

Figure 2A:
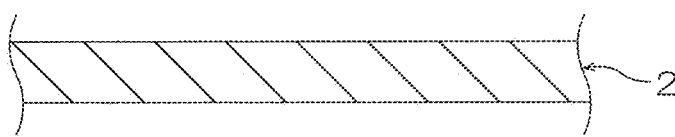
FIGS. 2A to 2F illustrate the steps of a method of producing the wiring circuit board illustrated in FIG. 1.

As illustrated in FIG. 2A, in this method, a metal supporting layer 2 is prepared first.

Figure 2B:
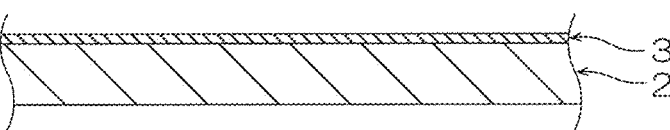

As illustrated in FIG. 2B, next, an adhesion layer 3 is formed on the one-side surface of the metal supporting layer 2 in the thickness direction. The method of forming the adhesion layer 3 is not limited. To form the adhesion layer 3, for example, the one-side surface of the metal supporting layer 2 is bombarded.

In the bombardment process, a plasma processing device is used. The plasma processing device not illustrated includes, for example, a container, a gas supply member, a depressurizing member, an electrode member, and a holder. The container accommodates the gas supply member, the depressurizing member, the electrode member, and the holder. The gas supply member is capable of supplying a bombardment gas in the container. Examples of the bombardment gas include an inert gas. Examples of the inert gas include argon, nitrogen, and a mixture thereof. The depressurizing member is capable of reducing the pressure in the container. The electrode member contains the above-described first metal. The electrode member is capable of applying high-frequency voltages to the first metal. The holder is capable of holding the metal supporting layer 2 thereon. The holder faces the electrode member with an interval therebetween.

The metal supporting layer 2 is placed on the holder so that the one-side surface of the metal supporting layer 2 faces the electrode portion. The depressurizing member depressurizes the inside of the container. The bombardment gas is supplied from the gas supply member to the inside of the container. The high-frequency voltages are applied to the first metal at the electrode member. Plasma is produced in proximity to the electrode member. The one-side surface of the metal supporting layer 2 is exposed to the plasma. At the exposure, the metal particles of the electrode member adhere to the one-side surface of the metal supporting layer 2, thereby forming the adhesion layer 3 on the one-side surface of the metal supporting layer 2.

Figure 2C:
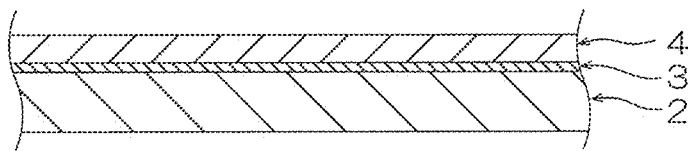

As illustrated in FIG. 2C, next, a first conductive layer 4 is formed on the one-side surface of the adhesion layer 3 in the thickness direction. Examples of the method of forming the first conductive layer 4 include a dry method and a wet method. A dry method is preferably used. A vacuum film formation method is more preferably used. Sputtering is even more preferably used.

Figure 2D:
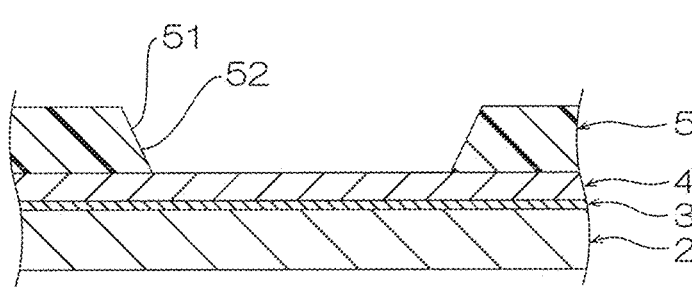

As illustrated in FIG. 2D, next, an insulating layer 5 is formed on the one-side surface of the first conductive layer 4 in the thickness direction. For example, a photosensitive varnish containing insulating resin is applied to the one-side surface of the first conductive layer 4 to form a photosensitive coating film. By photolithography, an insulating layer 5 having a penetrating hole 51 is formed from the photosensitive coating film.

Figure 2E:
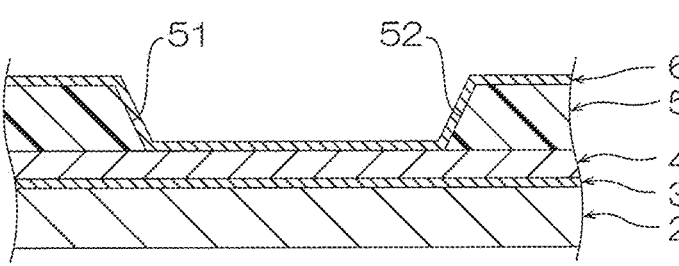

As illustrated in FIG. 2E, next, a second adhesion layer 6 is formed on the one-side surface and inner surface 52 of the insulating layer 5 and on the one-side surface of the first conductive layer 4 located in the penetrating hole 51. The method of forming the second adhesion layer 6 is, for example, the same as that of the adhesion layer 3.

Figure 2F:
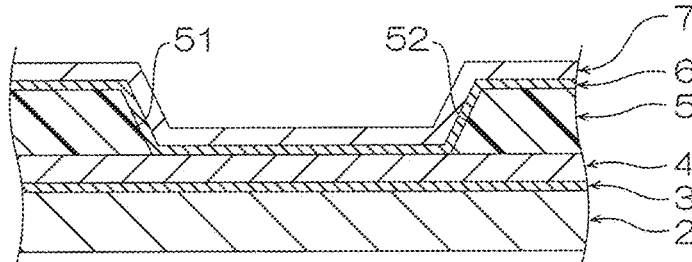

As illustrated in FIG. 2F, next, a second conductive layer 7 is formed on the one-side surface of the second adhesion layer 6 in the thickness direction. The method of forming the second conductive layer 7 is, for example, the same as that of the first conductive layer 4.

As illustrated in FIG. 1, next, a third conductive layer 8 is formed on the one-side surface of the second conductive layer 7 in the thickness direction. The third conductive layer 8 is formed into a predetermined pattern, for example, by a wiring method such as an additive method.

Thereafter, an insulating cover layer is formed so as to cover a part of the third conductive layer 8.

2. Operations and Effects

The wiring circuit board 1 includes the adhesion layer 3 disposed on the one-side surface of the metal supporting layer 2 in the thickness direction and containing the first metal that is at least one selected from the group consisting of Zr, Ti, W, Mo, V, Y, Nb, and Ta. This improves the adhesion of the first conductive layer 4 to the metal supporting layer 2.

Where the content ratio of the first metal in the adhesion layer 3 is 0.8% or less, i.e., low, the increase in the resistance of the interface between the adhesion layer 3 and the metal supporting layer 2 and the increase in the resistance of the interface between the adhesion layer 3 and the first conductive layer 4 are suppressed while the adhesion of the adhesion layer 3 to the metal supporting layer 2 is secured.

The wiring circuit board 1 further includes the second adhesion layer 6. This enables the second conductive layer 7 to be in tight contact with the insulating layer 5 and with the first conductive layer 4 located in the penetrating hole 51 when being projected in the thickness direction.

4. Variations

In each of the variations described below, the same members and steps as the above-described embodiment are given the same numerical references and the descriptions thereof are omitted. Further, each of the variations has the same operations and effects as those of one embodiment unless especially described otherwise. One embodiment and its variations can appropriately be combined.

4.1. First Variation

The metal supporting layer 2 may be multi-layered. Specifically, as illustrated with the phantom line of FIG. 1, the metal supporting layer 2 includes a body layer 21 and a front surface layer 22 in sequence toward one side in the thickness direction.

The body layer 21 is placed in the other end portion of the metal supporting layer 2 in the thickness direction. Examples of the material of the body layer 21 include a copper alloy. The body layer 21 has a thickness of, for example, 14 μm or more, and, for example, 499 μm or less, preferably 248 μm or less.

The front surface layer 22 is disposed in a one end portion of the metal supporting layer 2 in the thickness direction. The front surface layer 22 is in contact with a one-side surface of the body layer 21 in the thickness direction. The material of the front surface layer 22 has a resistance, for example, lower than that of the material of the body layer 21. Examples of the material of the front surface layer 22 include copper. The front surface layer 22 has a thickness of, for example, 0.5 μm or more and, for example, 3.0 μm or less.

4.2. Second Variation

Figure 3:
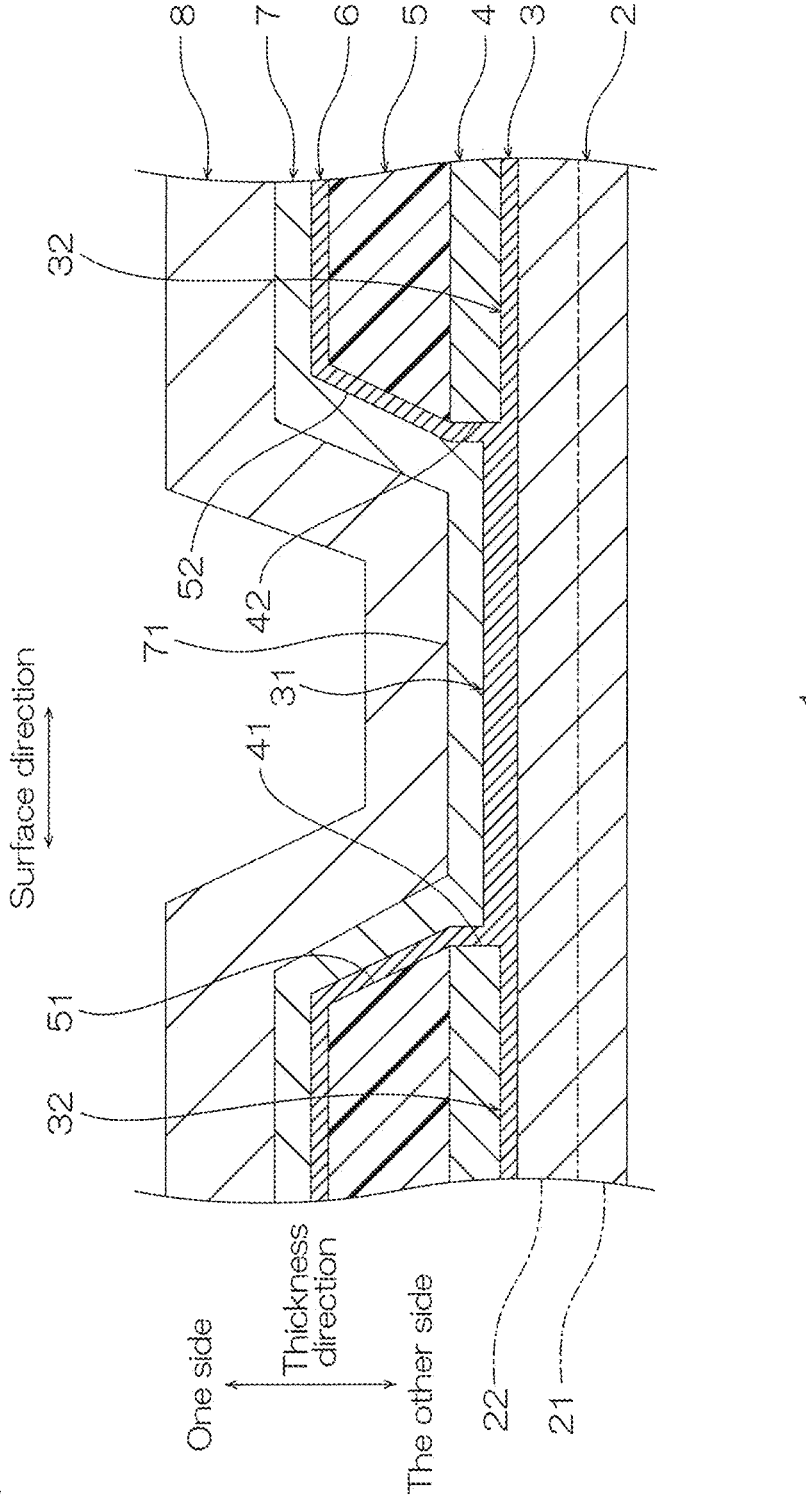
FIG. 3 is a cross-sectional view of a part of a second variation of the wiring circuit board.

As illustrated in FIG. 3, in the second variation, the adhesion layer 3 located on the one-side surface of the metal supporting layer 2 in the penetrating hole 51 is thicker than the adhesion layer 3 located on the one-side surface of the metal supporting layer 2 outside the penetrating hole 51. The portion located on the one-side surface of the metal supporting layer 2 in the penetrating hole 51 is a thick-walled portion 31. The portion located on the one-side surface of the metal supporting layer 2 outside the penetrating hole 51 is a thin-walled portion 32. The thick-walled portion 31 and the thin-walled portion 32 are included in the adhesion layer 3.

In the second variation, the first conductive layer 4 has a penetrating hole 41. The penetrating hole 41 communicates with the penetrating hole 51 of the insulating layer 5. The first conductive layer 4 includes an inner surface 42 defined by the penetrating hole 41. The inner surface 42 is continuous to the inner surface 52 of the insulating layer 5. The second adhesion layer 6 is formed on the inner surface 42 of the first conductive layer 4.

Figure 4A:
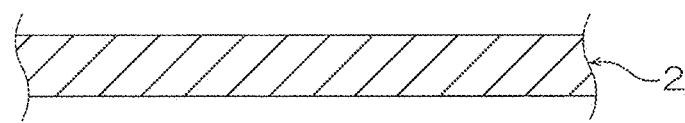
FIGS. 4A to 4F illustrate the steps of a method of producing the wiring circuit board illustrated in FIG. 3.

To produce the second variation of the wiring circuit board 1, as illustrated in FIG. 4A, a metal supporting layer 2 is prepared first.

Figure 4B:
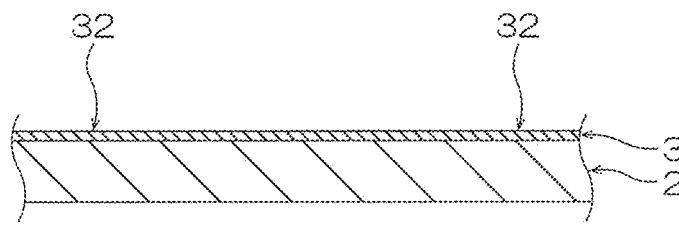

As illustrated in FIG. 4B, next, an adhesion layer 3 is formed on the one-side surface of the metal supporting layer 2 in the thickness direction. The adhesion layer 3 in this step has the same (uniform) thickness entirely in the surface direction. The adhesion layer 3 includes the above-described thin-walled portion 32 and a part of the thick-walled portion 31 (see FIG. 4E).

Figure 4C:
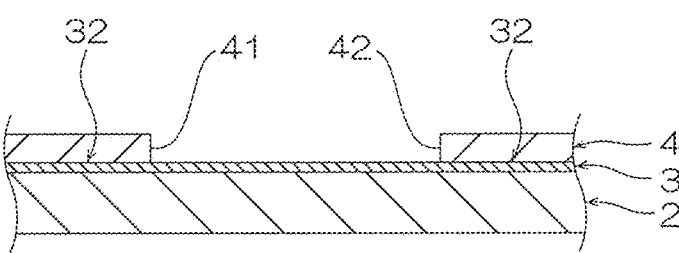

As illustrated in FIG. 4C, next, a first conductive layer 4 having a penetrating hole 41 is formed on the one-side surface of the adhesion layer 3 (the thin-walled portion 32) in the thickness direction.

Figure 4D:
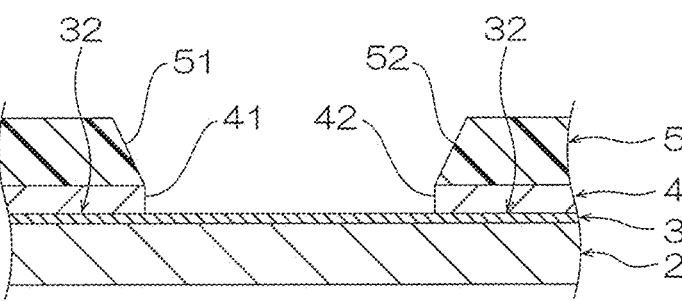

As illustrated in FIG. 4D, next, an insulating layer 5 having a penetrating hole 51 is formed on the one-side surface of the first conductive layer 4 in the thickness direction.

Figure 4E:
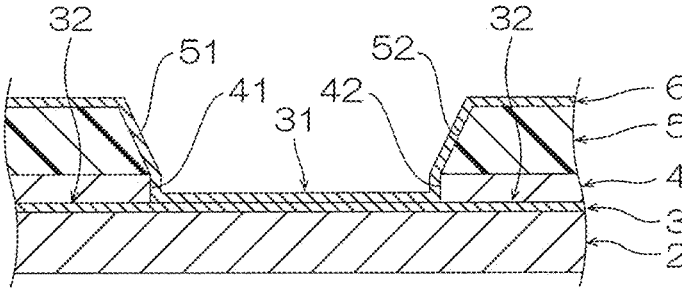

As illustrated in FIG. 4E, next, the other part of the thick-walled portion 31 of the adhesion layer 3 is formed on the one-side surface of the thin-walled portion 32 located in the penetrating hole 41, and simultaneously a second adhesion layer 6 is formed on the one-side surface and inner surface 52 of the insulating layer 5 and on the inner surface 42 of the first conductive layer 4. In the other end portion of the penetrating hole 41 in the thickness direction, the above-described part and the other part are layered and form the thick-walled portion 31. In the thick-walled portion 31, as illustrated in FIG. 4E, the boundary between the part and the other part of the thick-walled portion 31 may be observed. As illustrated in FIG. 3, the boundary between the part and the other part of the thick-walled portion 31 may not be observed.

Figure 4F:
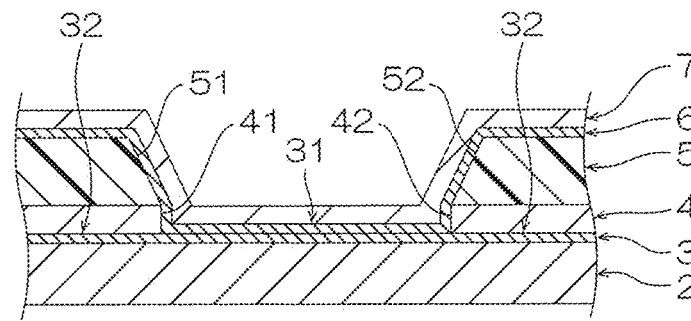

As illustrated in FIG. 4F, thereafter, a second conductive layer 7 is formed on the one-side surface of the second adhesion layer 6.

As illustrated in FIG. 3, thereafter, a third conductive layer 8 is formed on the one-side surface of the second conductive layer 7 in the thickness direction.

As illustrated with the phantom line of FIG. 3, the metal supporting layer 2 includes a body layer 21 and a front surface layer 22 in sequence toward one side in the thickness direction.

4.3 Third Variation

Figure 5:
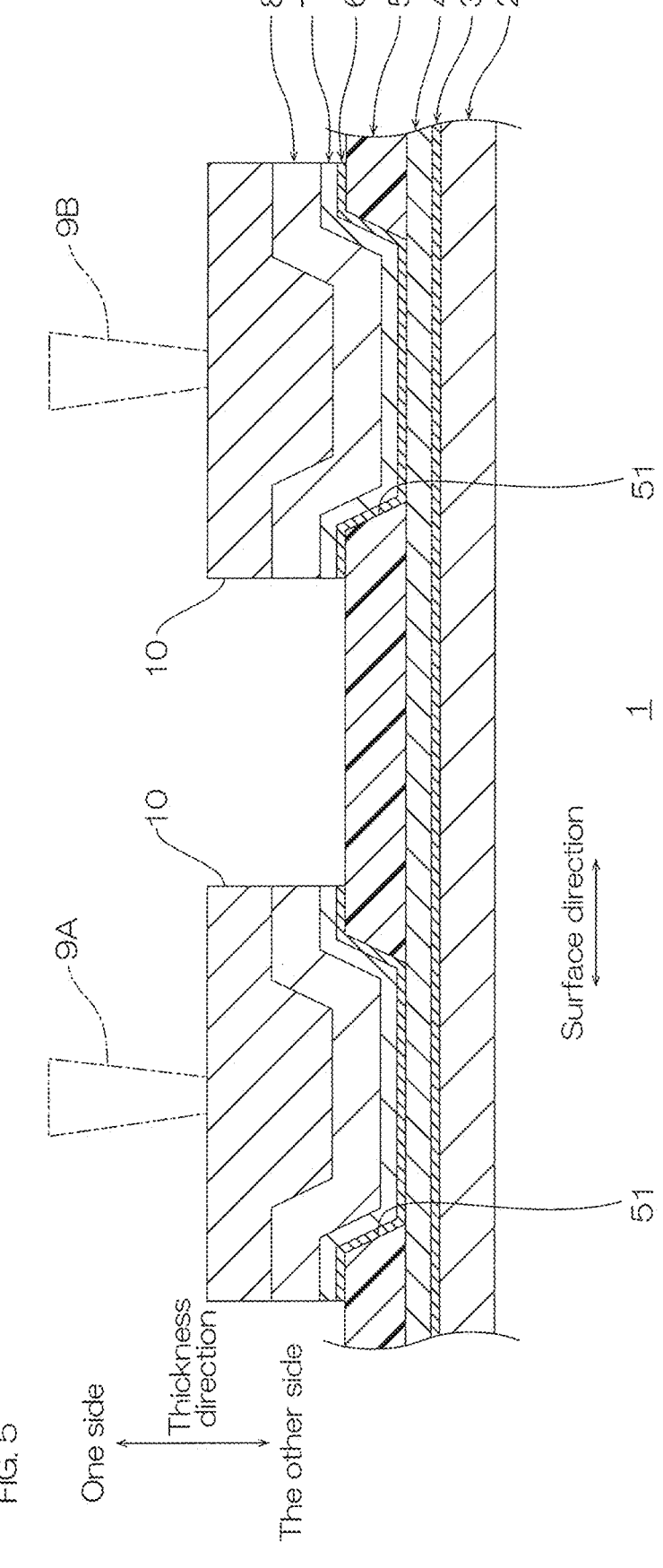
FIG. 5 is a schematic view of the evaluation of the resistance of Example.

A plurality of penetrating holes 51 may be included. As illustrated in FIG. 5, the penetrating holes 51 are spaced at intervals in the surface direction.

4.4 Fourth Variation

Although not illustrated, the wiring circuit board 1 may not include the second adhesion layer 6.

EXAMPLES

The present invention is more specifically described with reference to Examples and Comparative Examples below. The present invention is not limited to Examples and Comparative Examples in any way. The specific numeral values used in the description below, such as content ratios, physical property values, and parameters, can be replaced with the corresponding content ratios, physical property values, and parameters in the above-described "DESCRIPTION OF THE EMBODIMENTS", including the upper limit values (numeral values defined with "or less" or "less than") or the lower limit values (numeral values defined with "or more" or "more than").

Example 1

As illustrated in FIG. 2A, first, a metal supporting layer 2 consisting of a copper alloy having a thickness of 100 µm was prepared.

As illustrated in FIG. 2B, next, an adhesion layer 3 was formed on the one-side surface of the metal supporting layer 2 in the thickness direction. The above-described bombardment process was used to form the adhesion layer 3. The output of the high-frequency voltages was 300 W in the bombardment process. The first metal of the electrode member of the plasma processing device was Zr. The adhesion layer 3 had a thickness of 20 nm. The adhesion layer 3 contained Zr.

As illustrated in FIG. 2C, next, a first conductive layer 4 consisting of Cr having a thickness of 50 nm was formed on the one-side surface of the adhesion layer 3 in the thickness direction.

As illustrated in FIG. 2D, next, an insulating layer 5 having two penetrating holes 51 (see FIG. 5) was formed on the one-side surface of the adhesion layer 3 in the thickness direction. The material of the insulating layer 5 was polyimide.

As illustrated in FIG. 2E, next, a second adhesion layer 6 was formed on the one-side surface and inner surface 52 of the insulating layer 5 and on the one-side surface of the first conductive layer 4 located in the penetrating hole 51. The second adhesion layer 6 was formed with the same method as that of the adhesion layer 3. The second adhesion layer 6 had a thickness of 20 nm. The second adhesion layer 6 contained Zr.

As illustrated in FIG. 2F, thereafter, a second conductive layer 7 consisting of Cr having a thickness of 50 nm was formed on the one-side surface of the second adhesion layer 6 in the thickness direction.

As illustrated in FIG. 1, thereafter, a third conductive layer 8 consisting of Cu having a thickness of 50 µm was formed on the one-side surface of the second conductive layer 7 in the thickness direction.

In this manner, a wiring circuit board 1 was produced.

Example 2

In the same manner as the production of Example 1, a wiring circuit board 1 was produced. However, in the formation of the adhesion layer 3, the output of high-frequency voltages in the bombardment process was changed to 700 W.

Example 3

In the same manner as the production of Example 1, a wiring circuit board 1 was produced. However, in the formation of the second adhesion layer 6, the output of high-frequency voltages in the bombardment process was changed to 700 W.

Comparative Example 1

In the same manner as the production of Example 1, a wiring circuit board 1 was produced. However, an adhesion layer 3 was not formed.

1. Evaluations 1.1 Thickness of Adhesion Layer 3

The thickness of the adhesion layer 3 was obtained using dynamic SIMS.

1.2 Content Ratio of Zr in Adhesion Layer 3

The content ratio of Zr in the adhesion layer 3 was measured using dynamic SIMS.

The results are shown in Table 1.

1.3 Adhesiveness 1.3.1 First Adhesiveness

For the first adhesiveness, the adhesion layer 3 was evaluated.

Figure 6A:
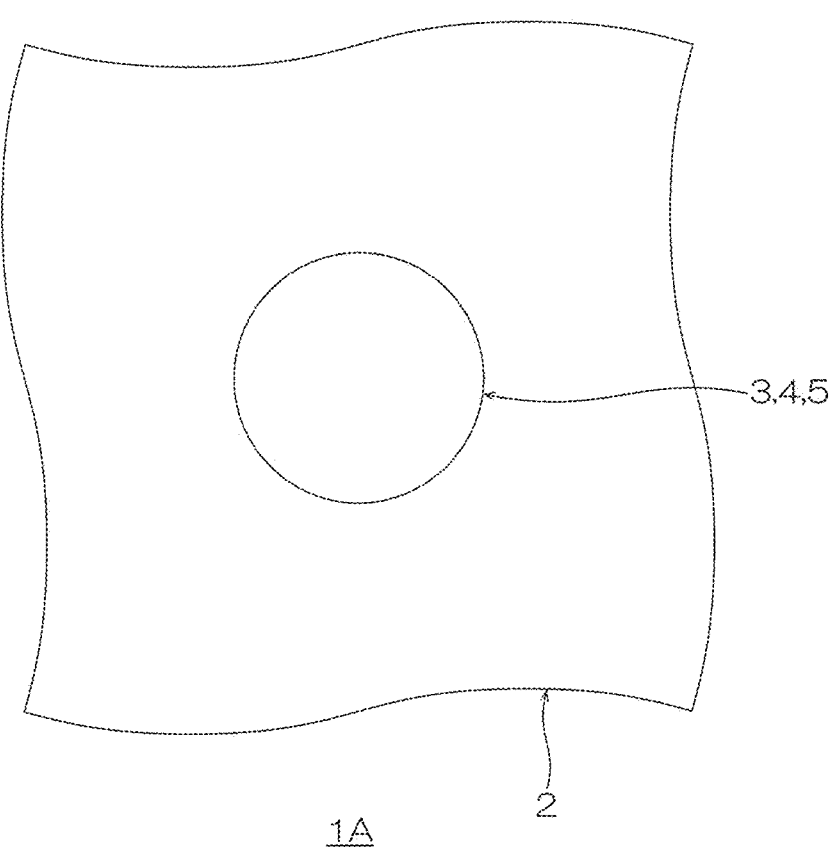
FIGS. 6A and 6B are schematic views of the evaluation of the first adhesiveness of Example.
Figure 6B:
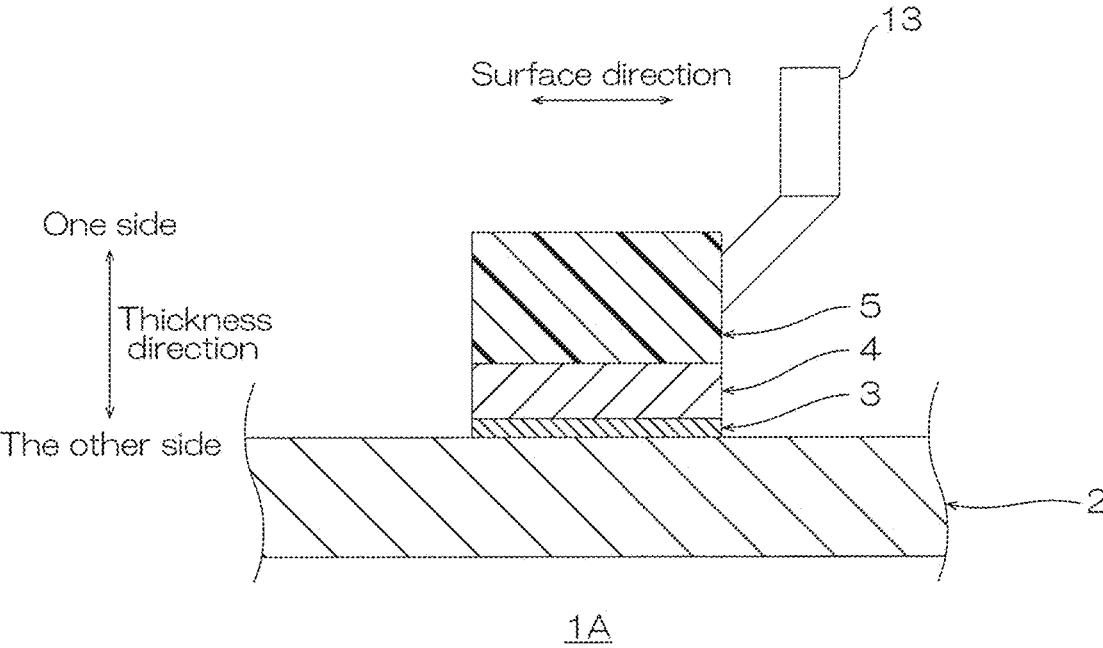

As illustrated in FIG. 6A and FIG. 6B, an in-process wiring circuit board 1A including a metal supporting layer 2, an adhesion layer 3, a first conductive layer 4, and an insulating layer 5 was prepared. The adhesion layer 3, the first conductive layer 4, and the insulating layer 5 had the same pattern. The pattern had a circular shape.

Next, a jig 13 was laterally moved at a rate of 50 µm/second, and pressed to the side surfaces of the first conductive layer 4 and insulating layer 5. The load until the first conductive layer 4 and the insulating layer 5 were released from the metal supporting layer 2 was measured as the load capacity. Based on the load capacity, the adhesion layer 3 was evaluated as follows.

Good: The load capacity was 20 g or more.

Bad: The load capacity was less than 20 g.

The results are shown in Table 1.

1.3.2 Second Adhesiveness

For the second adhesiveness, the second adhesion layer 6 was evaluated.

Figure 7A:
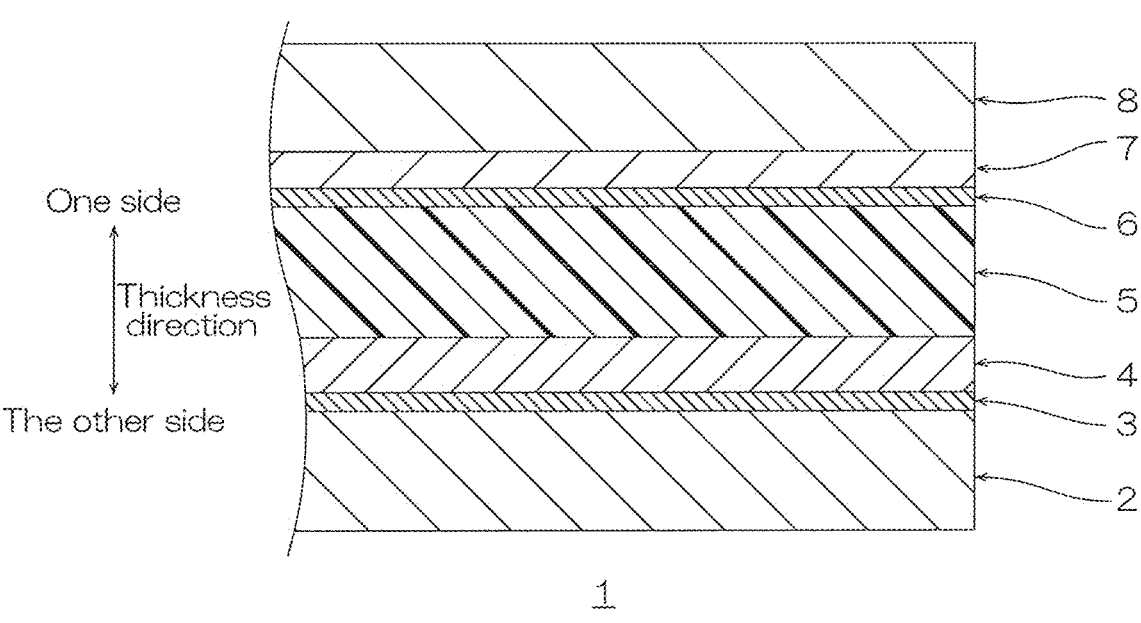
FIGS. 7A and 7B are schematic views of the evaluation of the second adhesiveness of Example.

As illustrated in FIG. 7A, a wiring circuit board 1 included a metal supporting layer 2, an adhesion layer 3, a first conductive layer 4, an insulating layer 5, a second adhesion layer 6, a second conductive layer 7, and a third conductive layer 8 in the thickness direction. The outside shape of the wiring circuit board 1 was processed into a size of 30 mm long and 2 mm wide, thereby preparing a test board 1S. In the test board 1S, the insulating layer 5 did not have a penetrating hole 51.

Figure 7B:
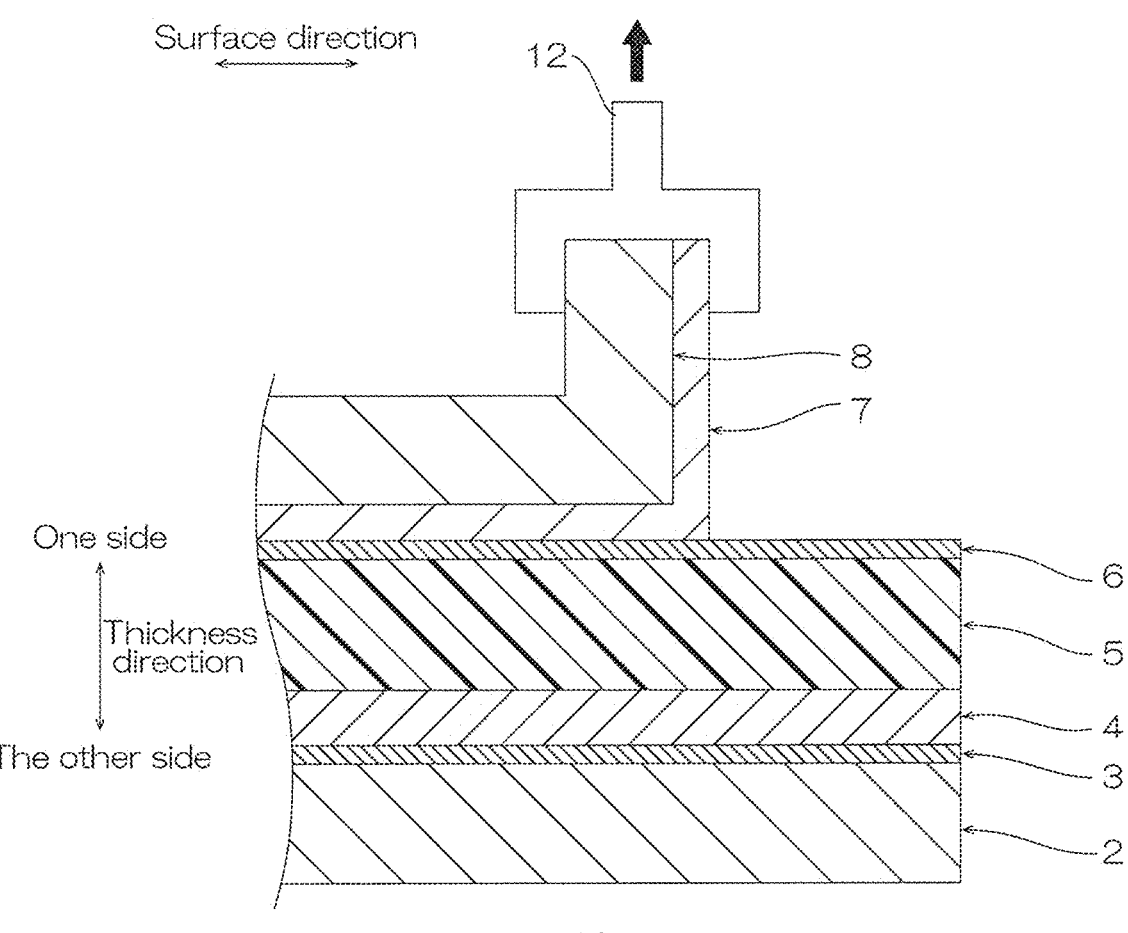

As illustrated in FIG. 7B, one end portions of the second conductive layer 7 and the third conductive layer 8 were held with a jig 12, and pulled up toward one side in the thickness direction at a rate of 10 mm/min (90° peeling). The load capacity at the peeling was measured. By the following criteria, the adhesiveness of the second adhesion layer 6 was evaluated.

Good: The load capacity was 30 g or more.

Bad: The load capacity was less than 30 g.

The results are shown in Table 1.

1.4 Measurement of Resistance (Electrical Connection Reliability)

As illustrated in FIG. 5, the wiring circuit board 1 of Example 1 had patterns each including two penetrating holes 51 when being projected in the thickness direction. In each pattern, two conductive portions (the fourth conductive layers) 10 were formed on the one-side surfaces of the two third conductive layers 8, respectively. Next, probes 9A and 9B were brought into contact with the two conductive portions 10, respectively, to measure the resistance between the probes 9A and 9B. In this manner, the electrical connection reliability of the wiring circuit board 1 was evaluated. By the following criteria, the resistance was measured at 100 of the above-described patterns.

Good: There were 10 patterns or less where the resistance was 0.01562 or more.

Fair: There were 11 patterns or more and 80 patterns or less where the resistance was 0.01552 or more.

Bad: There were 81 patterns or more where the resistance was 0.01562 or more.

The wiring circuit boards 1 of Examples 2 and 3 and Comparative Example 1 were evaluated in the same manner as Example 1.

The results are shown in Table 1.

TABLE 1

| | Zr Content in adhesion layer (%) | Zr Content in second adhesion layer (%) | First adhe- siveness | Second adhe- siveness | Electrical connection reliability |
|---|---|---|---|---|---|
| Example 1 | 0.5 | 0.5 | ○ | ○ | ○ |
| Example 2 | 1.0 | 0.5 | ○ | ○ | Δ |
| Example 3 | 0.5 | 1.0 | ○ | ○ | Δ |
| Comparative example 1 | 0.0 | 0.0 | X | X | ○ |

While the illustrative embodiments of the present invention are provided in the above description, such is for illustrative purpose only and it is not to be construed as limiting in any manner. Modification and variation of the present invention that will be obvious to those skilled in the art is to be covered by the following claims.

DESCRIPTION OF REFERENCE NUMERALS 1, 1A wiring circuit board 2 metal supporting layer 3 adhesion layer 4 first conductive layer 5 insulating layer 6 second adhesion layer 7 second conductive layer 8 third conductive layer 51 penetrating hole 71 portion

The invention claimed is:

1. A wiring circuit board comprising:

a metal supporting layer;

an adhesion layer disposed on a one-side surface of the metal supporting layer in a thickness direction and containing at least one metal selected from the group consisting of Zr, Mo, V, Y, Nb, and Ta;

a first conductive layer disposed on a one-side surface of the adhesion layer in the thickness direction;

an insulating layer having a penetrating hole and disposed on a one-side surface of the first conductive layer in the thickness direction; and a second conductive layer including a portion that is located in the penetrating hole, the portion that is electrically connected with the metal supporting layer through the adhesion layer.

2. The wiring circuit board according to claim 1, wherein a content ratio of the metal in the adhesion layer is more than 0.0% and 0.8% or less, the content ratio being a peak strength ratio measured using dynamic SIMS.

3. The wiring circuit board according to claim 1, wherein the first conductive layer contains Cr and/or Ni.

4. The wiring circuit board according to claim 1, wherein the metal supporting layer contains Cu.

5. The wiring circuit board according to claim 1, further comprising: a second adhesion layer disposed between the first conductive layer and the second conductive layer in the penetrating hole.

6. The wiring circuit board according to claim 5, wherein the second adhesion layer contains at least one metal selected from the group consisting of Zr, Ti, W, Mo, V, Y, Nb, and Ta.

7. The wiring circuit board according to claim 6, wherein the second conductive layer contains at least one selected from the group consisting of Cu, Cr, and Ni.

8. The wiring circuit board according to claim 1, wherein the first conductive layer has a second penetrating hole communicating with the penetrating hole of the insulating layer, wherein the adhesion layer includes:

a first portion disposed in the second penetrating hole; and a second portion disposed between the metal supporting layer and the first conductive layer, and wherein the first portion is thicker than the second portion.

9. The wiring circuit board according to claim 1, further comprising a third conductive layer disposed on a one-side surface of the second conductive layer in the thickness direction.

* * * * *